(12) United States Patent
Hayashi et al.

(10) Patent No.: US 10,431,725 B2
(45) Date of Patent: *Oct. 1, 2019

(54) LIGHT EMITTING DEVICE INCLUDING DIFFERENT SHAPES OF LIGHT EMITTING ELEMENT HAVING HIGHER LIGHT EXTRACTION EFFICIENCY

(71) Applicant: NICHIA CORPORATION, Anan-shi, Tokushima (JP)

(72) Inventors: Masaki Hayashi, Anan (JP); Tomohisa Kishimoto, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/019,643

(22) Filed: Jun. 27, 2018

(65) Prior Publication Data

US 2018/0323357 A1    Nov. 8, 2018

Related U.S. Application Data

(62) Division of application No. 15/384,777, filed on Dec. 20, 2016, now Pat. No. 10,121,948.

(30) Foreign Application Priority Data

Dec. 22, 2015   (JP) ................................. 2015-249488

(51) Int. Cl.
*H01L 33/46* (2010.01)
*H01L 33/48* (2010.01)
(Continued)

(52) U.S. Cl.
CPC .............. *H01L 33/62* (2013.01); *H01L 33/20* (2013.01); *H01L 33/46* (2013.01); *H01L 33/483* (2013.01);
(Continued)

(58) Field of Classification Search
CPC ......... H01L 33/62; H01L 33/20; H01L 33/46; H01L 33/483
(Continued)

(56) References Cited

U.S. PATENT DOCUMENTS 8,492,776 B2    7/2013 Nagai
10,121,948 B2 *  11/2018 Hayashi .................. H01L 33/20
(Continued)

FOREIGN PATENT DOCUMENTS

JP    H11-340576 A    12/1999
JP    2000-124508 A    4/2000
(Continued)

*Primary Examiner* — Didarul A Mazumder
(74) *Attorney, Agent, or Firm* — Hunton Andrews Kurth LLP

(57) ABSTRACT

A light emitting device includes: a package forming a recess, having a first lead and a second lead arranged on a bottom surface of the recess and a resin section on a lateralwall of the recess to fix the leads, and being in a substantially rectangular shape surrounded by upper sides of the lateralwalls of the recess; a light emitting element arranged on the first lead and being in a parallelogram shape; a second wire electrically connecting the light emitting element to the second lead; and reflective members covering inner surfaces of the lateralwalls on a diagonal line at corners in the recess, wherein one side of the light emitting element adjacent to the second lead is substantially in parallel to one side of the first lead or the second lead.

20 Claims, 7 Drawing Sheets

(51) Int. Cl.
*H01L 33/60* (2010.01)
*H01L 33/62* (2010.01)
*H01L 33/20* (2010.01)

(52) U.S. Cl.
CPC ............ *H01L 33/486* (2013.01); *H01L 33/60* (2013.01); *H01L 2224/48247* (2013.01)

(58) Field of Classification Search
USPC .................. 257/98; 438/22, 25, 26, 27, 29
See application file for complete search history.

(56) References Cited

U.S. PATENT DOCUMENTS

| | | | |
|---|---|---|---|
| 2007/0001187 A1 | 1/2007 | Kim | |
| 2007/0019412 A1 | 1/2007 | Han | |
| 2008/0258156 A1 | 10/2008 | Hata | |
| 2009/0261374 A1* | 10/2009 | Hayashi | H01L 33/62 257/99 |
| 2010/0047947 A1* | 2/2010 | Yashima | H01S 5/223 438/40 |
| 2013/0207145 A1 | 5/2013 | Schneider et al. | |
| 2013/0200412 A1 | 8/2013 | Schneider et al. | |
| 2014/0087498 A1 | 3/2014 | Terayama et al. | |
| 2015/0236230 A1* | 8/2015 | Miyata | H01L 33/62 257/98 |
| 2016/0013377 A1 | 1/2016 | Ozeki | |

FOREIGN PATENT DOCUMENTS

| | | | |
|---|---|---|---|
| JP | 2000-261038 A | 9/2000 | |
| JP | 2003-249112 A | 9/2003 | |
| JP | 2005-005433 A | 1/2005 | |
| JP | 2006-086469 A | 3/2006 | |
| JP | 2006-135309 A | 5/2006 | |
| JP | 2006-156837 A | 6/2006 | |
| JP | 2007-019505 A | 1/2007 | |
| JP | 2007-027431 A | 2/2007 | |
| JP | 2011-009707 A | 1/2011 | |
| JP | 2011-023704 A | 2/2011 | |
| JP | 2011-0253846 A | 12/2011 | |
| JP | 4995722 B2 | 8/2012 | |
| JP | 2012-212850 A | 11/2012 | |
| JP | 2013-534733 A | 9/2013 | |
| JP | 2013-535111 A | 9/2013 | |
| JP | 2014-082453 A | 5/2014 | |
| JP | 2015-026698 A | 2/2015 | |

* cited by examiner

LIGHT EMITTING DEVICE INCLUDING DIFFERENT SHAPES OF LIGHT EMITTING ELEMENT HAVING HIGHER LIGHT EXTRACTION EFFICIENCY

CROSS-REFERENCE TO RELATED PATENT APPLICATION

This is a divisional application of U.S. patent application Ser. No. 15/384,777, filed Dec. 20, 2016, which claims priority to Japanese Patent Application No. 2015-249488 filed on Dec. 22, 2015, the disclosure of all of which is hereby incorporated by reference in their entireties.

BACKGROUND

The present disclosure relates to a light emitting device.

Alight emitting device using a semiconductor light emitting element such as a light emitting diode LED is highly desired to be made smaller, to have higher light extraction efficiency, higher power and higher reliability in a field such as backlights, illuminations and on-vehicle lights. Especially, a side-view light emitting device for a backlight is highly desired to be made smaller and thinner, and to have higher efficiency and higher power.

For example, Japanese Unexamined Patent Application Publication No. 2005-5433 discloses an optical semiconductor device in which one or more light emitting elements in a square shape in a plan view are arranged at an angle of 45 degrees with respect to an axis perpendicular to a layout surface in a recess of a resin package.

However, as the light emitting device disclosed in Japanese Unexamined Patent Application Publication No. 2005-5433, if a light emitting element in a square shape is arranged at an angle of 45 degrees with respect to the axis perpendicular to the layout surface, amounting space having at least a width and a height of a diagonal line of a square is needed for the light emitting element. Therefore, in the mounting region for mounting the light emitting element, an area of the light emitting elements arranged per unit area is decreased, causing the luminance of the light emitting device to be reduced.

SUMMARY

An object of the certain embodiments of the present disclosure is to provide a light emitting device having higher light extraction efficiency.

According to certain embodiments of the present invention, a light emitting device includes, with respect to an X-axis, a Y-axis orthogonal to the X-axis, and a Z-axis orthogonal to the X-axis and the Y-axis: a package that forms a recess in the Z-axis direction, has a first lead and a second lead arranged on a bottom surface of the recess and a resin section on a lateralwall of the recess to fix the first lead and the second lead, and is in a substantially rectangular shape when viewed in the Z-axis direction which is surrounded by an upper side of the lateralwall of the recess; alight emitting element that is arranged on the first lead and is in a polygonal shape other than a rectangular shape when viewed in the Z-axis direction; a second wire that electrically connects the light emitting element to the second lead; and a reflective member that covers an inner surface of the lateralwall at one or more corners out of four corners in the recess, wherein one side of the light emitting element adjacent to the second lead is substantially in parallel to at least part of one side of the first lead or the second lead, when viewed in the Z-axis direction.

According to other embodiments of the present invention, a light emitting device includes, with respect to an X-axis, a Y-axis orthogonal to the X-axis, and a Z-axis orthogonal to the X-axis and the Y-axis: a package that forms a recess in the Z-axis direction, has a first lead and a second lead arranged on a bottom surface of the recess and a resin section on a lateralwall of the recess to fix the first lead and the second lead, and is in a protruding convex shape in a negative direction of the Y-axis when viewed in the Z-axis direction which is surrounded by an upper side of a lateralwall of the recess; a light emitting element that is arranged on the first lead and is in a trapezoidal shape in which a lower base extending in the negative direction of the Y-axis is shorter than an upper base extending in a positive direction of the Y-axis, when viewed in the Z-axis direction; a second wire that electrically connects the light emitting element to the second lead; and a reflective member that covers an inner surface of the lateralwall at one or more corners in the recess, wherein one side of the light emitting element adjacent to the second lead is substantially in parallel to at least part of one side of the first lead or the second lead, when viewed in the Z-axis direction.

With the above configuration, a light emitting device having higher light extraction efficiency is provided.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
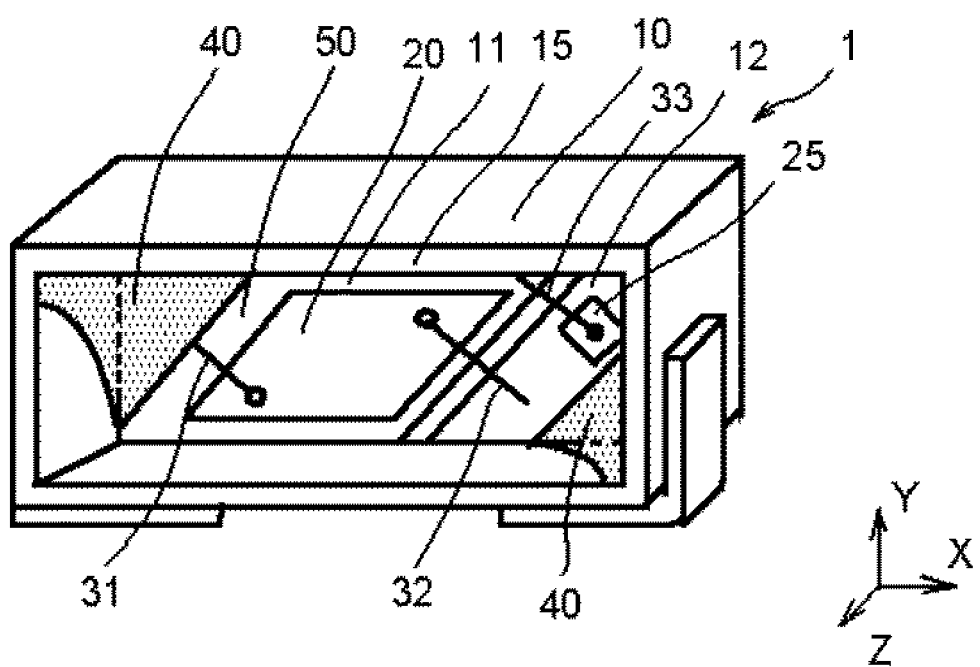
FIG. 1 is a perspective view illustrating a configuration of a light emitting device according to a first embodiment.

The embodiments will now be described with reference to the accompanying drawings, wherein like reference numerals designate corresponding or identical elements throughout the various drawings.

Hereinafter, a light emitting device and a method of manufacturing the same according to embodiments will be described with reference to the drawings.

Note that drawings referred to in the following description generally show the following embodiments, so that the scales, intervals, positional relationships and so on of members shown in the drawings may be exaggerated or a parts of members may be omitted. Further, for example, the scales, intervals and so on of members in a plan view may not correspond those in a cross-sectional view. Still further, in the following description, those having the same names and symbols are generally the same or equivalent members, and detailed description thereof is appropriately omitted.

Still further, in the description of the light emitting device and the method of manufacturing the same according to the embodiments, an "upper", a "lower", a "right" and a "left" may be interchangeable depending on the situation. In the specification, the "upper", the "lower" and the like show relative positions of components in the drawings to be referred to for description, and are not meant to illustrate absolute positions unless otherwise noted.

Yet further, in the specification, an X-axis, a Y-axis orthogonal to the X-axis, and a Z-axis orthogonal to the X-axis and the Y-axis are used as coordinate axes. In addition, a package is arranged on a plane surface expanding in the X-axis direction and the Y-axis direction, and a recess is arranged in the Z-axis direction. A surface when the package is viewed in the negative direction of the Z-axis is defined as a plane surface, a surface when the package is viewed in the positive direction of the Z-axis is defined as a back surface, a surface is defined when the package is viewed in the negative direction of the Y-axis is defined as an upper surface, a surface when the package is viewed in the positive direction of the Y-axis is defined as a lower surface, a surface when the package is viewed in the negative direction of X-axis is defined as a right lateral surface, and a surface when the package is viewed in the positive direction of the X-axis is defined as a left lateral surface. A surface when the recess of the package is viewed in the negative direction of the Z-axis is defined as a bottom surface of the recess. In the following description, the positive and negative directions may be omitted.

First Embodiment

Figure 2:
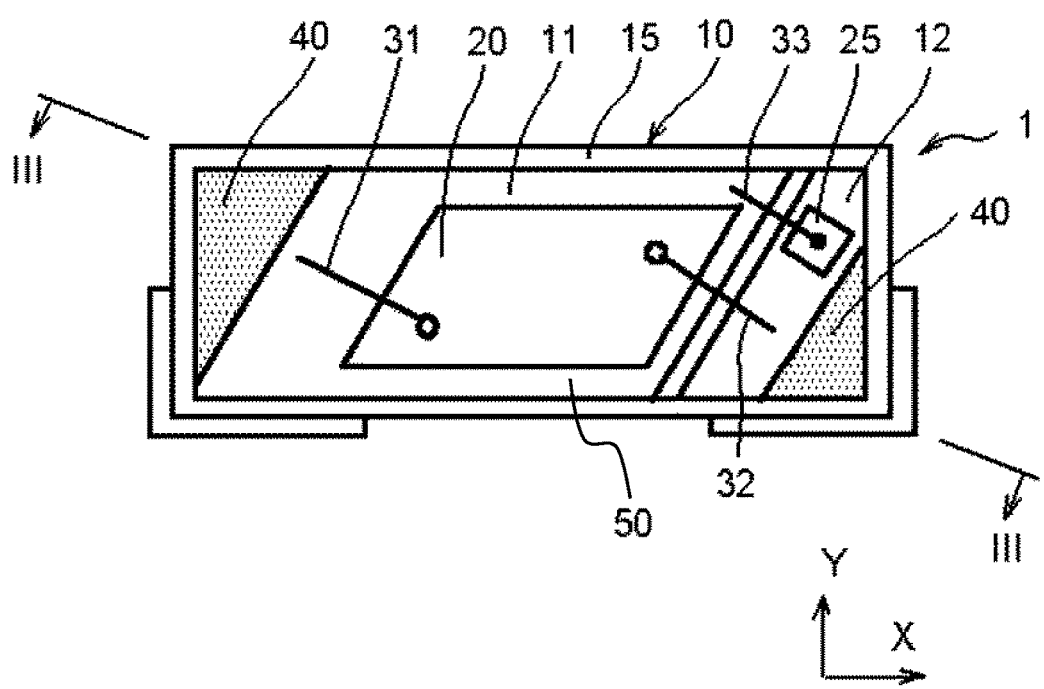
FIG. 2 is a plan view illustrating the configuration of the light emitting device according to the first embodiment.
Figure 3:
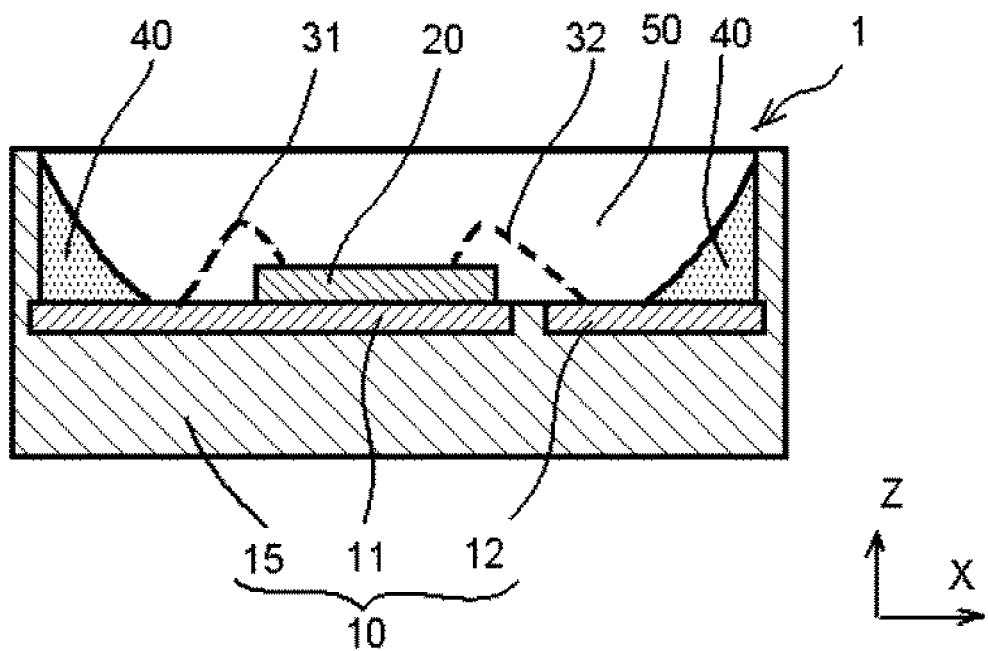
FIG. 3 is a cross-sectional view illustrating the configuration of the light emitting device according to the first embodiment taken along a III-III line in FIG. 2.

A configuration of a light emitting device according to a first embodiment will be described with reference to the accompanying drawings. FIG. 1 is a perspective view illustrating a configuration of the light emitting device according to a first embodiment, FIG. 2 is a plan view thereof, and FIG. 3 is a cross-sectional view thereof taken along a III-III line in FIG. 2.

A light emitting device 1 according to the first embodiment includes a package 10, a light emitting element 20, a second wire 32 and reflective members 40.

The package 10 forms a recess in the Z-axis direction, and includes a first lead 11 and a second lead 12 which are arranged on the bottom surface of the recess, and a resin section 15 on the lateralwalls of the recess to fix the first lead 11 and the second lead 12. The resin section 15 is also arranged between the first lead 11 and the second lead 12.

The package 10 exhibits a substantially rectangular shape as viewed in the Z-axis direction, surrounded by the upper sides of the lateralwalls of the recess. This substantially rectangular shape refers to the inner area of the lateralwalls of the recess, that is, inside the upper sides. The "substantially rectangular shape" includes not only a rectangle but also a square as a kind of rectangles, a rectangle in a case where the lateralwalls have irregularities in a part or overall, and a rectangle having not only right-angled corners but also slightly rounded corners.

The lateralwalls of the recess preferably have the inner surfaces which expand in the Z-axis direction and are orthogonal to the X-axis and the Y-axis, but may have inclined surfaces expanding in the positive direction of the Z-axis. The inner surface of the lateralwall may incline at an angle larger than 90 degrees but equal to 135 degrees or less from the bottom surface of the recess with respect to the plane surface expanding in the X-axis direction and the Y-axis direction. The inclined surfaces expand toward an opening, allowing more light originating from the light emitting element 20 to be extracted in the positive direction of the Z-axis.

The first lead 11 and the second lead 12 may be bent toward outside the recess, or may be in a flat-plate shape without being bent. Parts of the first lead 11 and the second lead 12 are exposed from the resin section 15 on the bottom surface of the recess. On the back surface of the package 10, the first lead 11 and the second lead 12 are not exposed from the resin section 15, but may be exposed therefrom. Exposing the first lead 11 and the second lead 12 from the resin section 15 allows for electrically connecting with external electrodes through the back surface of the package 10.

The first lead 11 is aligned with the second lead 12 in the X-axis direction, in a predetermined interval so as not to be short-circuited. The side of the first lead 11 adjacent to the second lead 12 is inclined with respect to the Y-axis direction, and the side of the second lead 12 adjacent to the first lead 11 is inclined with respect to the Y-axis direction. Here, the adjacent sides of the first lead 11 and the second lead 12 across a gap therebetween are in parallel, but may not be in parallel. The gap between the first lead 11 and the second lead 12 is inclined with respect to the Y-axis, for example, at an angle between 5 degrees and 45 degrees. The side of the first lead 11 adjacent to the second lead 12 is inclined with respect to the Y-axis direction, for example, at an angle between 5 degrees and 45 degrees. The side of the second lead 12 adjacent to the first lead 11 is inclined with respect to the Y-axis direction, for example, between 5 degrees and 45 degrees.

The light emitting element 20 is arranged on the first lead 11. The light emitting element 20 is mounted on the first lead 11 with a resin or a metal.

The light emitting element 20 is in a polygonal shape when viewed in the Z-axis direction, except for a rectangle such as an oblong and a square. The light emitting element 20 may take a polygonal shape such as triangular, pentagonal, hexagonal and octagonal. The light emitting element 20 may also take a shape such as a regular triangle or pentagon, but may preferably take a shape such as an isosceles triangle which is longer in the X-axis direction than in the Y-axis direction, a pentagon and a hexagon. This is because the luminous efficiency can be improved by increasing an area of the light emitting element 20 with respect to the bottom surface of the recess. Further, for example, the light emitting element 20 may take a shape of parallelogram. The light emitting element 20 in a parallelogram shape has two facing sides extending in the X-axis direction and in parallel to the lateralwalls of the package 10. The other two facing sides of the light emitting element 20 in a parallelogram shape are inclined with respect to the Y-axis, and are substantially in parallel to the side of the first lead 11 adjacent to the second lead 12. In particular, the side of the light emitting element 20 adjacent to the second lead 12 is substantially in parallel to the side of first lead 11 or the second lead 12. In the present specification, "substantially in parallel" includes not only in parallel physically but also in parallel to an extent that the sides do not intersect at least in the recess, and one side is inclined at an angle of 10 degrees or less, preferably at an angle of 5 degrees or less with respect to the other side.

The second wire 32 electrically connects the light emitting element 20 to the second lead 12. The second wire 32 connected to the second lead 12 can be shortened by arranging the second wire 32 substantially orthogonal to the side of the first lead 11 adjacent to the second lead 12. This restrains disconnection of the second wire 32 and improves bonding strength of the second wire 32. Here, "the substantially orthogonal" does not mean strictly at an angle of 90 degrees with respect to the side of the first lead 11, and may mean at an angle between 70 and 110 degrees. This is because the light emitting element 20 may be rotated by −10 to +10 degrees, and the first lead 11 may also be rotated by −10 to +10 degrees.

A first wire 31 electrically connects the light emitting element 20 to the first lead 11. For a light emitting element 20 having different kinds of electrodes on different surfaces, only the second lead is used and the first wire is not used.

The reflective members 40 cover the inner surfaces of the lateralwalls at one or more corners out of the four corners of the recess. Here, the reflective members 40 cover the two corners on a diagonal line in the recess. The reflective members 40 cover parts of two surfaces of the lateralwalls at the corners of the recess, part of the bottom surface of the recess and part of the wire.

With such a configuration, a light emitting device 1 is provided that has higher light emission luminance. This can be done by making the upper area of the recess smaller, using the light emitting element 20 having a predetermined shape. Further, light extraction efficiency of the light originating from the light emitting element 20 in the Z-axis direction can be increased. This is achieved by redirecting the light emitted from the light emitting element 20 in the X-axis direction to the Z-axis direction by the reflective members 40 at the corners in the recess.

The package 10 in a substantially rectangular shape preferably has sides in the X-axis direction longer than those in the Y-axis direction, and the light emitting element 20 preferably also has sides in the X-axis direction longer than those in the Y-axis direction. The light emitting device 1 is preferably of a lateral surface light emission type (side-view type), in which the lower surface of the package 10 is mounted so as to be in contact with the mounting substrate. With such a configuration, a compact light emitting device 1 of a lateral surface light emission type is provided. Here, a light emitting element 20 having a length in the X-axis direction longer than that in the Y-axis direction means that the longest part extending in the X-axis direction is longer than that extending in the Y-axis direction when the longest part in the X-axis direction is compared with that in the Y-axis direction. Arranging the package 10 in a substantially rectangular shape and the light emitting element 20 having the configuration above in the same direction allows for providing a compact light emitting device 1. Further, the luminance of the light emitting device 1 increases.

Preferably, one side of the light emitting element 20 is substantially in parallel to the reflective member 40 adjacent to the one side when viewed in the Z-axis direction. Here, "substantially in parallel" includes not only in parallel physically but also in parallel to an extent that the sides do not intersect at least in the recess, and one side is inclined at an angle of 10 degrees or less, preferably at an angle of 5 degrees or less with respect to the other side. With such a configuration, the light extraction efficiency of the light emitting device 1 in the Z-axis direction increases. Arranging the light emitting element 20 and the reflective member 40 in parallel to each other allows the light emitted from the light emitting element 20 toward the plane surface expanding in the X-axis direction and the Y-axis direction to be efficiently extracted in the positive direction of the Z-axis, without striking on the lateralwalls multiple times. The edge between the reflective member 40 and the first lead 11 or the second lead 12, or a boundary between the reflective member 40 and a sealing member 50 is substantially in parallel to one side of the light emitting element 20.

The upper surface of the reflective member 40 is preferably inclined with respect to the bottom surface of the recess. The reflective member 40 is preferably arranged to expand from the bottom surface toward the opening in the Z-axis direction. Thus, the light emitted from the light emitting element 20 toward the plane surface expanding in the X-axis direction and the Y-axis direction is efficiently extracted in the positive direction of the Z-axis, without striking on the lateralwall multiple times.

Preferably, the light emitting element 20 is substantially a parallelogram when viewed in the Z-axis direction, and the reflective members 40 cover the two corners on the diagonal line of the recess out of the four corners. Here, "substantially a parallelogram" includes not only two pairs of facing sides being in parallel physically but also those being in parallel to an extent that at least facing sides do not intersect, and one side is inclined at an angle of 10 degrees or less, preferably at an angle of 5 degrees or less with respect to the other side. The light emitting element 20 in a parallelogram shape can have the same light emission area as that of a light emitting element in a rectangular shape. Further, the second wire 32 for connecting the light emitting element 20 to the second lead 12 can be shortened, to reduce an area minimally required to mount the light emitting element 20. One side of the first lead 11 adjacent to the second lead 12 is substantially in parallel to one side of the light emitting element 20, and the one side of the first lead 11 adjacent to the second lead 12 is orthogonal to the second wire 32, to reduce an area required for mounting the light emitting element 20 and for bonding the second wire 32. Still further, after the second wire 32 is bonded, the reflective members 40 are arranged at the corners of the recess, to eliminate the need for a package 10 having a large recess and to reduce the size of the package 10.

Preferably, the side of the light emitting element 20 adjacent to the second lead 12 is substantially in parallel to the reflective members 40 covering the two corners on the diagonal line of the recess out of the four corners when viewed in the Z-axis direction. Here, "substantially in parallel" includes not only in parallel physically but also in parallel to an extent that the sides do not intersect at least in the recess, and one side is inclined 10 degrees or less, preferably at an angle of 5 degrees or less with respect to the other side. Thus, the light emitted from the light emitting element 20 to the plane surface expanding in the X-axis direction and the Y-axis direction can be extracted in the positive direction of the Z-axis, without striking on the lateralwall multiple times.

A protective element 25 may be arranged on the second lead 12. The protective element 25 is electrically connected with the first lead 11 through the third wire 33. The protective element 25 may be apart from the second wire 32 at a predetermined distance, and the light emitting element 20 may be arranged after the protective element 25 has been arranged. The protective element 25 is arranged in advance to mount the light emitting element 20 in high density. Further, destruction of the light emitting element 20 and disconnection of the second wire 32 and the third wire 33 can be restrained, which are caused by contact with a collet used in mounting the light emitting element 20 and the protection element 25. The protective element 25 and part of the third wire 33 are preferably covered with a reflective member.

The light emitting element 20, the inner surface of the recess and the reflective members 40 are covered with the sealing member 50. The sealing member 50 transmits the light originating from the light emitting element 20, and protects the light emitting element 20 from an external environment. The sealing member 50 may contain a fluorescent material, a light diffusion material or a filler.

Second Embodiment

Figure 4:
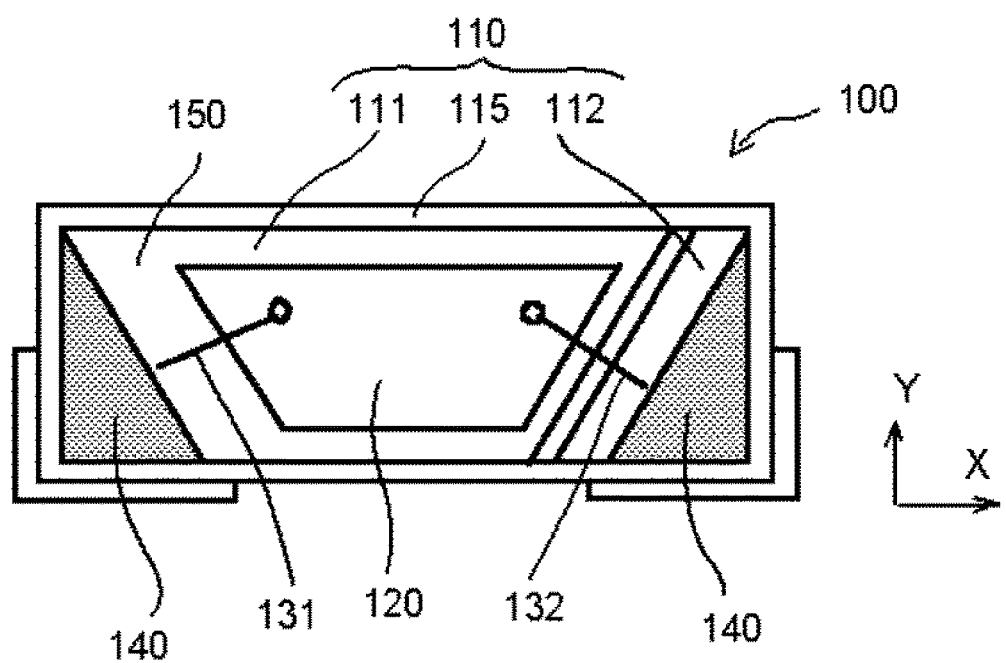
FIG. 4 is a plan view illustrating a configuration of a light emitting device according to a second embodiment.

A configuration of a light emitting device according to a second embodiment will be described with reference to the accompanying drawings. FIG. 4 is a plan view showing a configuration of a light emitting device according to the second embodiment. Descriptions for parts in the configuration of the light emitting device according to the second embodiment which are the same as those in the first embodiment may be omitted.

A light emitting device 100 according to the second embodiment includes a package 110, a light emitting element 120, a second wire 132 and reflective members 140. The package 110 is substantially the same as that in the first embodiment. The package 110 forms a recess in the Z-axis direction, and includes a first lead 111 and a second lead 112 arranged on the bottom surface of the recess and a resin section 115 which secures the first lead 111 and the second lead 112 and is arranged on the lateralwall of the recess. The resin section 115 is also arranged between the first lead 111 and the second lead 112.

The light emitting element 120 is in a trapezoidal shape when viewed in the Z-axis direction. The light emitting element 120 has, with respect to the center thereof, the upper base in the positive direction of the Y-axis and the lower base in the negative direction of the Y-axis, the upper base being longer than the lower base.

The side of the first lead 111 adjacent to the second lead 112 is substantially in parallel to the side of the light emitting element 120 adjacent to the upper base and lower base. Further, the side of the second lead 112 adjacent to the first lead 111 is substantially in parallel to the side of the light emitting element 120 adjacent to the upper base and lower base. Thus, arranging the sides substantially in parallel improves mountability of the light emitting element 120. Also, the side of the second lead 112 adjacent to the first lead 111 is orthogonal to the second wire 132 and the side of the light emitting element 120. This restrains disconnection of the second wire 132. In addition, the side of the light emitting element 120 is substantially in parallel to the reflective member 140. Arranging the sides substantially in parallel in this manner allows the light emitted from the light emitting element 120 to the plane surface expanding in the X-axis direction and the Y-axis direction to be efficiently reflected in the Z-axis direction, to improve the light extraction efficiency of the light originating from the light emitting device 100.

The light emitting element 120 is formed in a trapezoidal shape, to reduce its height in the Y-axis direction, and to reduce the width in the Y-axis direction of the package 110. Thus, in a case where the light emitting device 100 is of a lateral surface light emission type, a thin light emitting device is provided.

The reflective members 140 cover adjacent two corners out of the four corners in the recess. The reflective members 140 cover the inner surfaces of the lateralwalls on the lower surface and the left lateral surface, and those on the lower surface and the right lateral surface of the light emission device 100, each forming a substantially triangular pyramid shape. Of the four surfaces in a substantially triangular pyramid shape, three surfaces are in contact with the recess, and the remaining one surface is in contact with a sealing member 150. Accordingly, the light extraction efficiency of the light originating from the light emitting device 100 is improved. Further, the other side of the sides adjacent to the upper base and the lower base of the light emitting element 120 is substantially in parallel to the reflective member 140 covering the inner surfaces of the lateralwalls on the lower surface and the left lateral surface of the light emitting device 100. Accordingly, the light extraction efficiency of the light originating from the light emitting device 100 can be improved.

The upper base and the lower base of the light emitting element 120 in a trapezoidal shape are substantially in parallel to the inner surfaces of the lateralwalls of the recess. Accordingly, heat applied from the light emitting element 120 to the lateralwalls of the recess is made even, so that thermal degradation of the lateralwalls is restrained. Further, the light emitted from the light emitting element 120 in the Y-axis direction is emitted in the Z-axis direction.

A first wire 131 is electrically connected with the first lead 111. The other side of the light emitting element 120 is substantially orthogonal to the first wire 131. Accordingly, disconnection of the the first wire 131 is restrained. The surface of the reflective members 140 in contact with the sealing member 150 may be not only a plane surface, but also a rounded concave or convex surface. Further, the surface of the reflective member 140 in contact with the sealing member 150 may be not only a plane surface, but also a surface having fine irregularities. This is because of increasing the reflection efficiency and light diffusion efficiency of the reflective member 140.

The reflective members 140 may be made in contact with the first wire 131 and the second wire 132. The first wire 131 and the second wire 132 restrain leakage of the reflective members 140 toward the light emitting element 120. This prevents the reflective members 140 from contacting the light emitting element 120. The reflective members 140 are prevented from contacting the light emitting element 120, to allow the light originating from the light emitting element 120 to be emitted in the Z-axis direction efficiently. Further, thermal degradation of the reflective members 140 is restrained, which is caused by heat from the light emitting element 120.

A protective element may be arranged in the recess.

Third Embodiment

Figure 5:
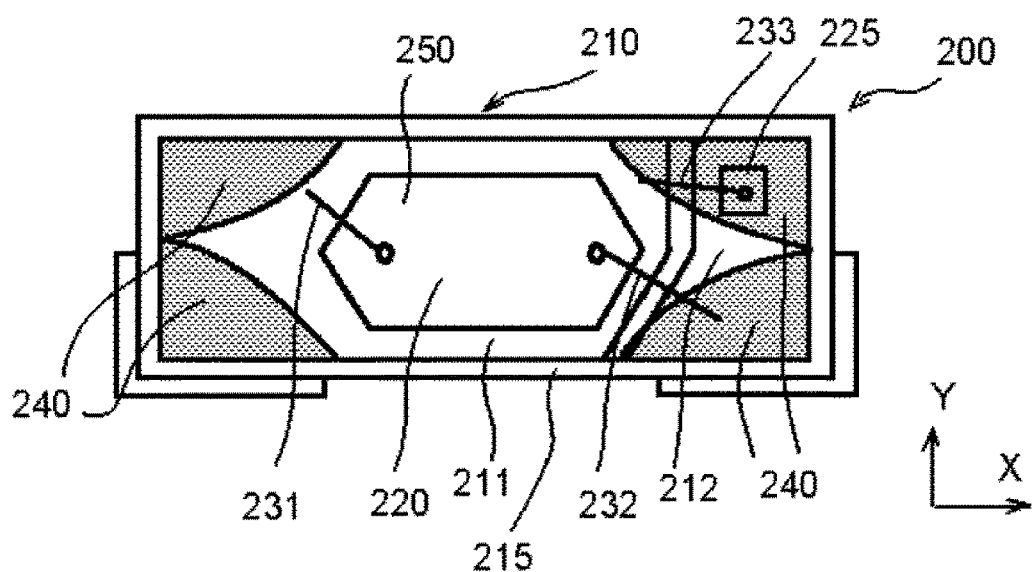
FIG. 5 is a plan view illustrating a configuration of a light emitting device according to a third embodiment.

A configuration of a light emitting device according to a third embodiment will be described with reference to the accompanying drawing. FIG. 5 is a plan view showing the configuration of a light emitting device according to the third embodiment. Descriptions of components in the configuration of the light emitting device according to the third embodiment which are the same as those in the first and the second embodiment may be omitted.

A light emitting device 200 according to the third embodiment includes a package 210, a light emitting element 220, a second wire 232 and reflective members 240. The package 210 is substantially the same as that in the first embodiment. The package 210 forms a recess in the Z axis direction, and includes a first lead 211 and a second lead 212 arranged on the bottom surface of the recess and a resin section 215 which secures the first lead 211 and the second lead 212 and is arranged on the lateralwalls of the recess. The resin section 215 is also arranged between the first lead 211 and the second lead 212.

The light emitting element 220 is in a hexagonal shape which is long in the X-axis direction, as viewed in the Z-axis direction. The light emitting element 220 has a shape such that three pairs of sides facing each other are in parallel, one pair out of the three pairs of sides is substantially in parallel to the inner surfaces of the lateralwalls of the recess, another pair out of the three pairs of sides is substantially in parallel to part of the second lead 212 adjacent to the light emitting element 220. Here, "substantially in parallel" includes not only in parallel physically but also in parallel to an extent that the sides do not intersect at least in the recess, and one side is inclined at an angle of 10 degrees or less, preferably at an angle of 5 degrees or less with respect to the other side. The light emitting element 220 has a shape in which the two sides in the X-axis direction are longer than the other sides.

The side of the first lead 211 adjacent to the second lead 212 is substantially in parallel to the side of the light emitting element 220 adjacent to the side extending in the X-axis direction. Further, the side of the second lead 212 adjacent to the first lead 211 is substantially in parallel to the side of the light emitting element 220 adjacent to the side extending in the X-axis direction. Thus, mountability of the light emitting element 220 is improved by setting the sides substantially in parallel in this manner. Also, the second wire 232 is orthogonal to one side of the light emitting element 220. Accordingly, disconnection of the second wire 232 is restrained. Further, one side of the light emitting element 220 is substantially in parallel to the reflective member 240. Arranging the sides substantially in parallel in this manner allows the light emitted to the plane surface expanding in the X-axis direction and the Y-axis direction from the light emitting element 220 to be efficiently reflected in the Z-axis direction, so that the light extraction efficiency of the light originating from the light emitting device 200 is improved.

Part of the side of the first lead 211 adjacent to the second lead 212 has a part extending in the Y-axis direction. Further, part of the side of the second lead 212 adjacent to the first lead 211 has a part extending in the Y-axis direction. This allows a protective element 225 to have a wide mounting region. Further, this allows a third wire 233 which electrically connects the protective element 225 with the first lead 211 to have a wide connecting region. Still further, the part extending in the Y-axis direction of the side of the first lead 211 adjacent to the second lead 212 and the part extending in the Y-axis direction of the side of the second lead 212 adjacent to the first lead 211 are substantially orthogonal to the third wire 233. This restrains disconnection of the third wire 233.

The reflective members 240 are arranged at all the four corners of the recess. The reflective members 240 cover parts of the inner surfaces of the lateralwalls of the recess and part of the bottom surface, and each of which is in a substantially triangular pyramid shape. Of the four surfaces of the substantially triangular pyramid, three surfaces are in contact with the recess, and the remaining one surface is in contact with the sealing member 250. Note that two reflective members 240 adjacent to each other in the Y-axis direction may be partially connected. This is because one reflective member 240 may be arranged before the other reflective member 240 is cured, so that parts thereof may be partially connected. Accordingly, the light extraction efficiency of the light originating from the light emitting device 200 is improved. Especially, the reflective members 240 are arranged at all the four corners in the recess, allowing for shortening the distance between the light emitting element 220 and the reflective members 240, to improve the light extraction efficiency of the light originating from the light emitting device 200. Further, the four sides out of the six sides of the light emitting element 220 are substantially in parallel to the reflective members 240, to improve the light extraction efficiency of the light originating from the light emitting device 200.

The two sides of the light emitting element 220 in a hexagonal shape extending in the X-axis direction are substantially in parallel to the inner surfaces of the lateralwalls of the recess. Accordingly, heat applied to the lateralwalls of the recess from the light emitting element 220 is made even, to restrain thermal degradation of the lateralwall. Further, the light emitted from the light emitting element 220 in the Y-axis direction is redirected in the Z-axis direction. Still further, the two sides of the light emitting element 220 in a hexagonal shape extending in the X-axis direction are shorter than the longest diameter in the X-axis direction, to restrain degradation of the lateralwalls of the recess.

The first wire 231 is electrically connected to the first lead 211. The other side of the light emitting element 220 is substantially orthogonal to the first wire 231. Accordingly, disconnection of the first wire 231 is restrained. The surface of the reflective member 240 in contact with the sealing member 250 may be not only a plane surface, but also a rounded concave or convex surface. Further, the surface of the reflective member 240 in contact with the sealing member 250 may be not only a plane surface, but also a surface having fine irregularities. This is because of increasing the reflection efficiency or light diffusion efficiency of the reflective members 240.

The reflective members 240 may be contacted with the first wire 231 and the second wire 232. The first wire 231 and the second wire 232 restrain leakage of the reflective member 240 to the light emitting element 220 side. This can prevent the reflective members 240 from contacting the light emitting element 220. Preventing the reflective members 240 from contacting the light emitting element 220 allows the light originating from the light emitting element 220 to be efficiently emitted in the Z-axis direction. Further, thermal degradation of the reflective members 240 is restrained, which is caused by heat from the light emitting element 220.

A protective element 225 is arranged on the second lead 212 in the recess. The protective element 225 is covered with the reflective member 240. Accordingly, the amount of light emitted from the light emitting element 220 which is absorbed by the protective element 225 is decreased, to improve the light extraction efficiency in the Z-axis direction as the light emitting device 200.

Fourth Embodiment

Figure 6:
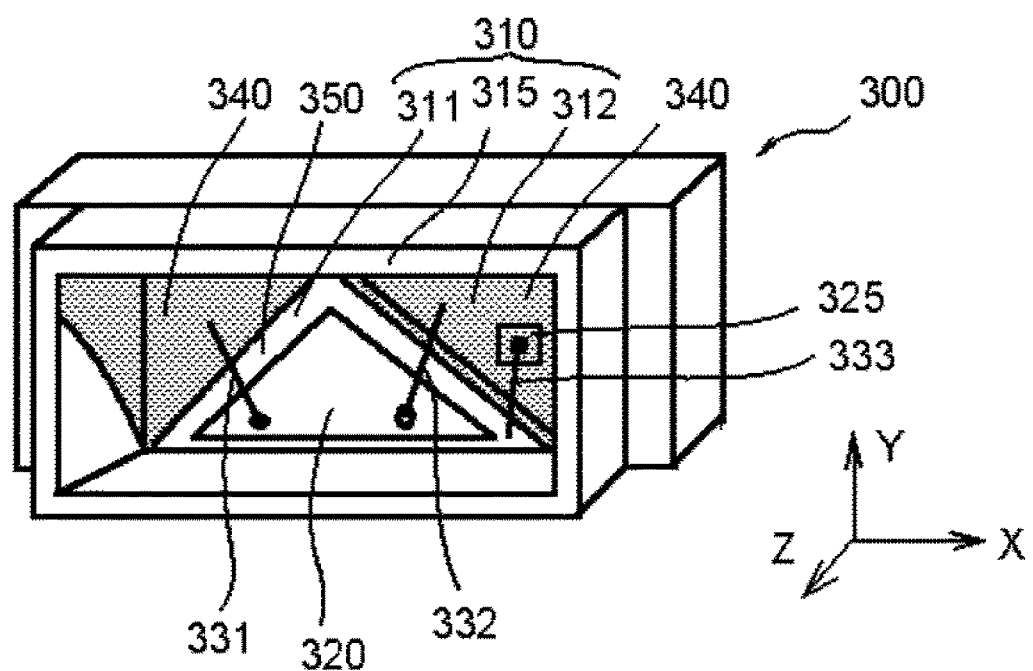
FIG. 6 is a perspective view illustrating a configuration of a light emitting device according to a fourth embodiment.

A configuration of a light emitting device according to the fourth embodiment will be described with reference to a drawing. FIG. 6 is a perspective view showing the configuration of the light emitting device according to the fourth embodiment. Descriptions of components in the configuration of the light emitting device according to the fourth embodiment which are the same as those in the first to third embodiments may be omitted.

A light emitting device 300 according to the fourth embodiment includes a package 310, a light emitting element 320, a second wire 332 and reflective members 340. The package 310 is substantially the same as that in the first embodiment except for the shapes of the first lead 311 and the second lead 312. The package 310 forms a recess in the Z-axis direction, and includes the first lead 311 and the second lead 312 arranged on the bottom surface of the recess and a resin section 315 which secures the first lead 311 and the second lead 312 and is arranged on the lateralwalls of the recess. Parts of the first lead 311 and the second lead 312 are arranged on the back surface of the package 310 so as to be connected with external electrodes. The package 310 is in a convex shape when viewed in the Y-axis direction. The first lead 311 and the second lead 312 are not folded and inner wirings electrically connect parts of the leads on the bottom surface of the recess with those on the back surface of the package.

The light emitting element 320 is in a triangular shape when viewed in the Z-axis direction. The triangular light emitting element 320 is preferably an isosceles triangle which is long in the X-axis direction. The longest side of the triangular light emitting element 320 is positioned closer to the lower surface of the package 310. Accordingly, heat from the light emitting element 320 is efficiently transmitted toward the mounting substrate.

The side of the first lead 311 adjacent to the second lead 312 is substantially in parallel to the side of the light emitting element 320 adjacent to the side extending in the X-axis direction. Further, the side of the second lead 312 adjacent to the first lead 311 is substantially in parallel to the side of the light emitting element 320 adjacent to the side extending in the X-axis direction. Still further, the second wire 332 is orthogonal to one side of the light emitting element 320. Yet further, one side of the light emitting element 320 is substantially in parallel to the reflective member 340. Arranging them substantially in parallel as described above allows the light emitted from the light emitting element 320 to the plane surface expanding in the X-axis direction and the Y-axis direction to be reflected efficiently in the Z-axis direction, to improve light extraction efficiency of the light originating from the light emitting device 300.

The reflective members 340 are mainly arranged at the two corners on the upper surface side out of the four corners of the recess. The reflective members 340 cover parts of the inner surfaces of the lateralwalls of the recess and part of the bottom surface, and cover the resin section 315 between the first lead 311 and the second lead 312. As a result, the light emitted from the light emitting element 320 is restrained from passing through the resin section 315 between the first lead 311 and the second lead 312, to improve the light extraction efficiency of the light originating from the light emitting device 300. A predetermined interval is provided between the reflective members 340 and the light emitting element 320, and the upper surfaces of the reflective members 340 are inclined to the Z-axis. The bottom surface of the recess is widely covered with the reflecting members 340, so that the light extraction efficiency of the light originating from the light emitting device 300 is improved.

The protection element 325 is covered with the reflective member 340. The light emitting element 320 is covered with a sealing member 350.

Fifth Embodiment

Figure 7:
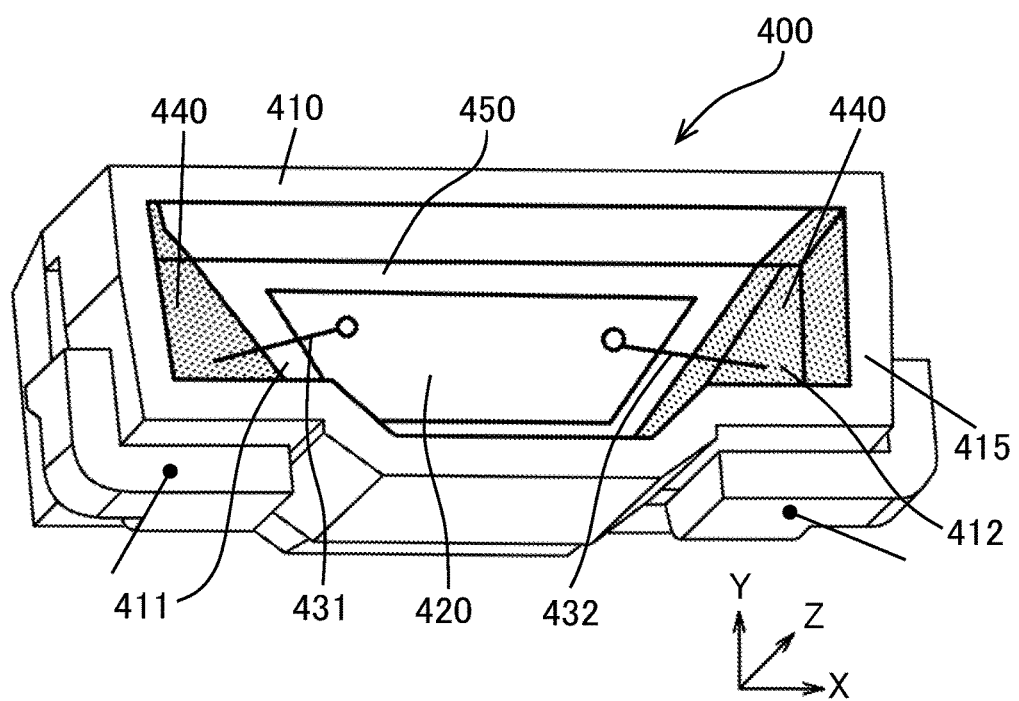
FIG. 7 is a perspective view illustrating a configuration of a light emitting device according to a fifth embodiment.

A configuration of a light emitting device according to a fifth embodiment will be described with reference to a drawing. FIG. 7 is a perspective view showing the configuration of the light emitting device according to the fifth embodiment. Descriptions of components in the configuration of the light emitting device according to the fourth embodiment which are the same as those in the first to third embodiments may be omitted.

The light emitting device 400 according to the fifth embodiment includes a package 410, a light emitting element 420, a second wire 432, and reflecting members 440. The package 410 forms a recess in the Z-axis direction, and includes a first lead 411 and a second lead 412 arranged on the bottom surface of the recess and a resin section 415 which secures the first lead 411 and the second lead 412 and is arranged on the lateralwalls of the recess. The resin section 415 is also arranged between the first lead 411 and the second lead 412.

The package 410 is in a convex shape in which the shape surrounded by the upper sides of the lateralwalls of the recess protrudes toward the negative direction of the Y-axis, when viewed in the Z-axis direction. This convex shape indicates the shape of inside the upper sides which are the inner surfaces of the lateralwalls of the recess. The "convex shape" includes not only a shape in which an intersection of the sides is formed at a right angle but also a shape in which a protruding part is oblique, an intersection of the sides is at an acute or obtuse angle other than a right angle, a shape in which irregularities are formed on parts or all of the lateralwalls, and a shape in which corners are slightly rounded as well as at a right angle.

The inner surfaces of the lateralwalls of the recess preferably expand in the Z-axis direction and are orthogonal to the X-axis and the Y-axis, but may be lateralwalls having inclined surfaces expanding in the positive direction in the Z-axis. The inclination angle of the inner surfaces of the lateralwalls can be greater than 90 degrees but equal to 135 degrees or less from the bottom surface of the recess with respect to the plane surface expanding in the X-axis and the Y-axis direction. Expanding the inclined surfaces toward the opening allows the light originating from the light emitting element 420 to be extracted more in the positive direction of the Z-axis.

The first lead 411 and the second lead 412 may be bent outside the recess, or may be in a flat-plate shape without being bent. Parts of the first lead 411 and the second lead 412 are exposed from the resin section 415 on the bottom surface of the recess.

The first lead 411 is aligned with the second lead 412 in the X-axis direction, having a predetermined interval so as not to be short-circuited. The side of the first lead 411 adjacent to the second lead 412 is inclined with respect to the Y-axis direction and the side of the second lead 412 adjacent to the first lead 411 is inclined with respect to the Y-axis direction. Here, the adjacent two sides of the first lead 411 and the second lead 412 are in parallel across the gap to each other, but may not be in parallel. The interval between the first lead 411 and the second lead 412 is inclined with respect to the Y-axis, for example, at an angle between 5 degrees to 45 degrees. The side of the first lead 411 adjacent to the second lead 412 is inclined with respect to the Y-axis direction, for example, at an angle between 5 degrees to 45 degrees. The side of the second lead 412 adjacent to the first lead 411 is inclined with respect to the Y-axis direction, for example, at an angle between 5 degrees to 45 degrees. The resin section 415 between the first lead 411 and the second lead 412 is preferably arranged on the straight line extending from the protruding part in a convex shape. Further, the resin section 415 between the first lead 411 and the second lead 412 may be arranged in parallel to the straight line extending from the protruding part in a convex shape.

The light emitting element 420 is in a trapezoidal shape when viewed in the Z-axis direction. The light emitting element 420 has, with respect to its center, an upper base in the positive direction of the Y-axis and a lower base in the negative direction of the Y-axis, the upper base being longer than the lower base.

The side of the first lead 411 adjacent to the second lead 412 is substantially in parallel to the side of the light emitting element 420 adjacent to the upper base and the lower base. Further, the side of the second lead 412 adjacent to the first lead 411 is substantially in parallel to the side of the light emitting element 420 adjacent to the upper base and the lower base. Thus, arranging the sides substantially in parallel improves mountability of the light emitting element 420. Also, the second wire 432 is orthogonal to the side of the second lead 412 adjacent to the first lead 411 and one side of the light emitting element 420. This restrains disconnection of the second wire 432. In addition, one side of the light emitting element 420 is substantially in parallel to the reflective member 440. Arranging them in parallel in this manner allows the light emitted from the light emitting element 420 to the plane surface expanding in the X-axis direction and the Y-axis direction to be efficiently reflected in the Z-axis direction, to improve the light extraction efficiency of the light originating from the light emitting device 400.

The light emitting element 420 is formed in a trapezoidal shape, to reduce its height in the Y-axis direction and the width in the Y-axis direction of the package 410. Thus, in a case where the light emitting device 400 is of a lateral surface light emission type, a thin light emitting device is provided. Further, the protruding part in a convex shape is substantially in parallel to the inclined sides of the trapezoid, to improve the light extraction efficiency of the light originating from the light emitting device 400. The package 410 is formed in a convex shape in accordance with the shape of the light emitting element 420, allowing the light emitting area to be reduced, so that the light emitting luminance is increased.

The reflective members 440 cover the adjacent corners of the recess. The reflective members 440 cover the inner surfaces of the lateralwalls on the lower surface and the left lateral surface, and those on the lower surface and the right lateral surface of the light emitting device 400. The reflective members 440 may cover parts of the inner surfaces of the lateralwalls on the upper surfaces of the light emitting device 400. The reflective members 440 may cover parts of a first wire 431 and a second wire 432. The reflective members 440 may be formed in a substantially triangular pyramid shape, or may be formed in a pentahedron. In a case of being a substantially triangle, three surfaces out of the four surfaces in a substantially pyramid shape are in contact with the recess and the remaining surface is in contact with a sealing member 450. In a case of being a pentahedron, four surfaces out of the five surfaces are in contact with the recess and the remaining surface is in contact with the sealing member 450. Accordingly, the light extraction efficiency of the light originating from the light emitting device 400 is improved. One side of the sides adjacent to the upper base and the bottom base of the light emitting element 420 is substantially in parallel to the reflective member 440 covering the inner surfaces of the lateralwalls on the lower surface and the right lateral surface of the light emitting device 400. Further, the other side of sides adjacent to the upper base and the lower base of the light emitting element 420 is substantially in parallel to the reflective members 440 covering the inner surfaces of the lateralwalls on the lower surface and the left lateral surface of the light emitting device 400. Accordingly, the light extraction efficiency of the light originating from the light emitting device 400 is improved. The reflective members 440 cover parts of the inner surfaces of the lateralwalls of the recess and part of the bottom surface, and cover the resin section 415 between the first lead 411 and the second lead 412. Accordingly, the light emitted from the light emitting element 420 is restrained from passing through the resin section 415 between the first lead 411 and the second lead 412, to improve the light extraction efficiency of the light originating from the light emitting device 400. A predetermined interval is provided between the reflective member 440 and the light emitting element 420, and the upper surface of the reflective member 440 is inclined in the Z-axis direction. The bottom surface of the recess is widely covered with the reflecting member 440, so that the light extraction efficiency of the light originating from the light emitting device 400 is improved.

The upper base and the lower base of the light emitting element 420 in a trapezoidal shape are substantially in parallel to the inner surfaces of the lateralwalls of the recess. Accordingly, heat applied from the light emitting element 420 to the lateralwalls of the recess is made even, to restrain thermal degradation of the lateralwalls. Further, the light emitted from the light emitting element 420 in the Y-axis direction is redirected in the Z-axis direction.

The first wire 431 is electrically connected to the first lead 411. The other side of the light emitting element 420 is substantially orthogonal to the first wire 431. The surface of the reflective member 440 in contact with the sealing member 450 may not only a plane surface, but also a rounded concave or convex surface.

A protective element may be arranged, for example, on the second lead 412 and may be covered with the reflective member.

Each Forming Member

Each forming member will be described in detail.

The package includes the first lead, the second lead, and the resin section.

The first lead and the second lead are a pair of electrodes corresponding to the positive and negative polarities. The first lead and the second lead are arranged in the resin section and each of which includes an inner lead for mounting the light emitting element and an outer lead which protrudes from the resin section and serves as a terminal for connecting with the mounting substrate.

The first lead and the second lead may be formed with a plate-like metal such as in a shape of a corrugated plate or a plate having irregularities. The thicknesses of the first lead and the second lead may be even or partially thicker or thinner.

The inner leads of the first lead and the second lead are arranged to be exposed from the resin section on the bottom surface of the recess of the resin section.

The external leads of the first lead and the second lead are formed continuously from the inner leads respectively having corresponding polarities and protrude from the right lateral surface and the left lateral surface of the resin section, to be bent toward the lower surface of the resin section so as to extend along the resin section.

Although the material for the first lead and the second lead is not particularly limited, they are preferably made of a material having relatively high thermal conductivity. The leads formed with such a material can radiate the heat generated in the light emitting element to an outside via the outer leads. The material forming the first lead and the second lead is preferably, for example, one having thermal conductivity of about 200 W/(m·K) or more, one having relatively large mechanical strength, or one to be easily applied with punching press or etching. Especially, metals such as copper, aluminum, gold, silver, tungsten, iron, nickel, alloys such as iron-nickel alloy and phosphor bronze may be used. Further, reflective plating of silver, gold, aluminum or the like having good light reflectivity is preferably applied to the surface of the inner leads exposed to the bottom surface of the recess, in order to efficiently extract the light originating from the mounted light emitting element to the outside.

The resin material used for the resin section preferably has a good light transmitting property for the wavelength of the light emitted from the light emitting element, and examples thereof may include a silicone resin, a silicone-modified resin, a silicone-hybrid resin, an epoxy resin, an epoxy-modified resin, a urea resin, a phenol resin, a polycarbonate resin, an acrylic resin, a polymethylpentene resin, a polynorbornene resin, a polyphthalamide resin, an unsaturated polyester resin, a polyester resin, a liquid crystal resin, a polyphenylene ether resin, a polyamide resin, and a hybrid resin containing one or more of the resins. Especially, in consideration of light resistance and heat resistance, an unsaturated polyester resin, a polyester resin, or a polyphthalamide resin is preferably used. As a polyamide resin, polyamide 6T, polyamide 9T, polyamide 10T, polyamide 6C, polyamide 9C and the like may be used.

In a light emitting device of a side light emitting type, a lateralwall of a recess of a resin section is very close to a light emitting element and the light is irradiated on the resin section with high intensity, so that the resin material needs light resistance. Therefore, especially, a polyamide resin containing no benzene ring in its chemical structure, such as polyamide 6C and polyamide 9C having good light resistance and heat resistance, is preferably used.

As a light reflective substance contained in the resin section, particles of a material having a large difference in refractive index from the resin material and having a good light transmitting property are preferably used.

Such a light reflective substance has, for example, a refractive index of 1.8 or more, preferably 2.0 or more to efficiently scatter light so as to obtain high light extraction efficiency, and more preferably 2.5 or more. The difference in refractive index from the resin material is, for example, 0.4 or more, preferably 0.7 or more to efficiently scatter light so as to obtain high light extraction efficiency, and more preferably 0.9 or more. Further, the average particle size of particles in a light reflective substance is preferably in a range between 0.08 μm and 10 μm to obtain a light scattering effect with high efficiency, and more preferably between 0.1 μm and 5 μm.

In this specification, it is assumed that an electron microscope is used to observe the value of the average particle size of particles such as of a light reflective substance and a fluorescent substance. The criterion based on the number of particles (distribution of the number of particles) is employed in which the primary diameter method of measuring the length of particles in a fixed axis direction is used to measure the size of particles with the electron microscope (SEM, TEM).

Further, as a light reflective substance, examples may be specifically particles of a white pigment, titanium oxide, zirconium oxide, magnesium oxide, magnesium carbonate, magnesium hydroxide, calcium carbonate, calcium hydroxide, calcium silicate, zinc oxide, barium titanate, and aluminum oxide. Among these, titanium oxide ($TiO_2$) is preferably used which is relatively stable to moisture and the like, and has a high refractive index and good thermal conductivity. In addition, fibrous mineral such as wollastonite is preferably contained as a light reflective substance. Using a fibrous mineral having a diameter of about 1 μm to 10 μm as a light reflective substance enhances strength of a package.

Further, to obtain better reflectivity, titanium oxide is preferably used as a light reflective substance if the light emitted by a light emitting element is visible, and aluminum oxide is preferably used as a light reflecting substance if the light is ultraviolet light.

Still further, the resin material contains a light reflective substance to an extent that sufficient light reflectivity is obtained and formability is not impaired at the time of forming the shape of a package. For that purpose, the content rate of the light reflective substance contained in the resin section is preferably between 10% by mass and 60% by mass.

The light emitting element is arranged in the recess of the package, and is electrically connected to the first lead and the second lead by the first wire and the second wire, respectively. The light emitting element is bonded on the bottom surface of the recess with a die bonding agent. A resin such as an epoxy resin and a silicone resin, or a metal such as gold, silver and gold tin is used as a die bonding agent.

Further, the light emitted by the light emitting element is emitted from the opening of the recess in the positive direction of the Z-axis through the light transmissive sealing member. Although only one light emitting element is mounted, a plurality of light emitting elements may be mounted. The plurality of light emitting elements may emit the same color or different colors.

The light emitting element can be selected to emit light having any wavelength of color according to an application. For example, a nitride semiconductor may be used as a light emitting element which emits blue light having a wavelength of 430 nm to 490 nm.

The first wire, the second wire and the third wire are conductive wires for electrically connecting electronic components such as a light emitting element and a protective element to the first lead and the second lead. As the material of the wires, a metal such as gold, silver, copper, platinum and aluminum and an alloy thereof may be used, and in particular, gold having good thermal conductivity and the like is preferably used. The thickness of the wires is not particularly limited, and may be properly selected depending on purpose and application.

The reflective members promote the light originating from the light emitting element to be emitted in the positive direction of the Z-axis toward the opening of the recess. Reflective members filled with a white pigment in a light transmissive resin are used.

Examples of the white pigment include titanium oxide, alumina, magnesium oxide, antimony oxide, aluminum hydroxide, barium sulfate, magnesium carbonate, and barium carbonate, which may be used individually or in combination. From the viewpoint of thermal conductivity and light reflectivity, titanium oxide, alumina, magnesium oxide, or a mixture thereof is preferably used. Further, the center particle size of the white pigment is preferably in a range between 0.1 μm to 5 μm. If the center particle size is 0.1 μm or more, the particles tend to less likely condense to have improved dispersibility, whereas if it is 5 μm or less, the particles tend to have high reflectance. In addition, a reinforcing material may be filled. For example, a fibrous filler may be used such as silicon oxide, aluminum oxide, zinc oxide, zirconium oxide, glass fiber and wollastonite.

The content of the reinforcing material is preferably between 10% by weight and 50% by weight.

As a light transmissive resin, for example, a thermosetting resin such as a silicone resin, an epoxy resin, a urea resin and a hybrid resin thereof, or a thermoplastic resin may be used. As the epoxy resin, a material commonly used as an epoxy resin molding material for sealing electronic components may be used. Though not particularly limited, examples of the epoxy resin include a phenol novolak epoxy resin, an epoxidized resin containing novolak resins of phenol, such as an orthocresol novolak epoxy resin, and aldehydes, a glycidylamine epoxy resin obtained by reaction of epichlorohydrin with diglycidyl ether such as bisphenol A, bisphenol F, bisphenol S, and alkyl-substituted biphenol, diaminodiphenylmethane, and polyamine such as isocyanuric acid, a linear aliphatic epoxy resin obtained by oxidizing an olefin bond with a peracid such as peracetic acid, and an alicyclic epoxy resin. These resins may be used individually or in combination of two or more resins. Preferably, an epoxy resin to be used is relatively uncolored. Such an epoxy resin may include a bisphenol A epoxy resin, a bisphenol F epoxy resin, a bisphenol S epoxy resin, and a triglycidyl isocyanate.

The reflective members preferably has a boundary with the sealing member. Forming the boundary between the reflective members and the sealing member allows the light originating from the light emitting element to be reflected by the reflective members, to emit the light to the outside efficiently. Note that the light extraction efficiency of the light originating from the light emitting device can be improved by highly filling the white pigment to be contained in the reflective members.

The sealing member protects the light emitting element, the protective element and the like from external force, dust, moisture and the like, and can improve heat resistance, weather resistance and light resistance of the light emitting element and the like. A suitable material for the sealing member includes a thermosetting resin, for example, a transparent material such as a silicone resin, an epoxy resin, and a urea resin. In addition to such materials, the sealing member may contain a fluorescent material or a filler as a substance having high light reflectance to have a predetermined function.

The sealing member may be mixed with, for example, a fluorescent material, to adjust a color tone of the light emitting device easily. The fluorescent material may include, for example, a yellow fluorescent material such as $Y_3Al_5O_{12}$:Ce (YAG) and $(Sr, Ba)_2SiO_4$:Eu (silicate), or a red fluorescent material such as $CaAlSiN_3$:Eu (CASN) and $K_2SiF_6$:Mn (KSF).

The filler to be contained in the sealing member may preferably include a substance having high light reflectance such as silicon dioxide, titanium oxide, aluminum oxide, zirconium oxide and magnesium oxide. Further, for the purpose of cutting off undesired wavelengths, for example, an organic or inorganic colored dye or pigment may be used.

The light emitting device can be manufactured by the following steps.

A package having a first lead and a second lead is prepared, and a light emitting element is mounted on the first lead with a die bonding agent. The light emitting element is connected to the first lead by a first wire and to the second lead by a second wire. Then, reflective members are arranged at predetermined corners out of the four corners of a recess. The reflective members are formed by dropping, spraying or the like. After the reflecting members are cured, a sealing member is arranged in the recess so as to cover the light emitting element.

In the case where a protective element is mounted, the protective element may be mounted after the light emitting element has been mounted, however, the light emitting element may preferably be mounted before the protective element is mounted. This is because the protective element is smaller than the light emitting element. Further, this is because the light emitting element is to be mounted around the center of the recess, whereas the protective element is mounted on a side close to a lateralwall of the recess. After the protection element is mounted, at least a part of the protective element is covered with the reflective member.

The viscosity of the reflective members is adjusted before molding, which allows the reflective member to be arranged only on the inner surfaces of the lateralwalls of the recess, without contacting the light emitting element. The viscosity of the reflective members may be adjusted by adjusting the content of the white pigment, the light diffusing agent or the like, in addition to adjusting the viscosity of the resin itself.

The light emitting device according to the embodiments of the present disclosure may be used in various light sources such as a backlight of a liquid crystal display, various illumination devices, a large display, various display devices such as for advertisement and destination guide, and further, an image reading device such as in a digital video camera, a facsimile, a copier and a scanner, and a projector. Further, the light emitting device according to the embodiments is described as a lateral surface light emission type (side-view type), but may be also applied to an upper surface light emission type (top-view type).

What is claimed is:

1. A light emitting device comprising, with reference to an X-axis, a Y-axis orthogonal to the X-axis, and a Z-axis orthogonal to the X-axis and the Y-axis:
    a package that forms a recess in the Z-axis direction, has a first lead and a second lead arranged on a bottom surface of the recess and a resin section on a lateralwall of the recess to fix the first lead and the second lead, and when viewed in the Z-axis direction a shape which is surrounded by an upper side of an inner area of the lateralwall of the recess is substantially rectangular;
    a light emitting element that is arranged on the first lead and is in a triangular shape when viewed in the Z-axis direction, and a longest side of the light emitting element is positioned closer to a lower surface of the package;
    a second wire that electrically connects the light emitting element to the second lead; and
    reflective members that cover a part of an inner surface of the lateralwall and a part of the bottom surface at upper corners in the recess,
    wherein one side of the light emitting element adjacent to the second lead is substantially in parallel to at least part of one side of the first lead or the second lead, when viewed in the Z-axis direction,
    wherein, of four surfaces of each reflective member, three surfaces are in contact with the recess, and one remaining surface is in contact with a sealing member, and
    wherein the reflective members are separated from each other.

2. The light emitting device according to claim 1, wherein the reflective members cover the resin section between the first lead and the second lead.

3. The light emitting device according to claim 1,
wherein the light emitting element is in an isosceles triangular shape.
4. The light emitting device according to claim 1,
wherein a part of the first lead and a part of the second lead are arranged on a back surface of the package.
5. The light emitting device according to claim 1,
wherein the reflective members are arranged at upper two corners out of four corners of the recess.
6. The light emitting device according to claim 1,
wherein each of the reflective members is in a substantially triangular pyramid shape.
7. The light emitting device according to claim 6,
wherein the substantially triangular pyramid shape defines the four surfaces of each reflective member.
8. The light emitting device according to claim 1,
wherein the light emitting element has a side extending in the X-axis direction, and
wherein one side of the first lead adjacent to the second lead is substantially parallel to a side of the light emitting element adjacent to the side extending in the X-axis direction.
9. The light emitting device according to claim 8,
wherein the one side of the first lead adjacent to the second lead is inclined at an angle of 10 degrees or less with respect to the side of the light emitting element adjacent to the side extending in the X-axis direction.
10. The light emitting device according to claim 1,
wherein upper surfaces of the reflective members are inclined to the Z-axis.
11. The light emitting device according to claim 1,
wherein a protective element is arranged on the second lead.
12. The light emitting device according to claim 11,
wherein the protective element is covered with one of the reflective members.
13. The light emitting device according to claim 11,
wherein the protective element is electrically connected with the first lead through a third wire.
14. The light emitting device according to claim 13,
wherein part of the third wire is covered with one of the reflective members.
15. The light emitting device according to claim 1,
wherein the lateralwall of the recess has inclined inner surfaces expanding in a positive direction of the Z-axis.
16. The light emitting device according to claim 15,
wherein each inner surface of the lateralwall inclines at an angle larger than 90 degrees but equal to 135 degrees or less from the bottom surface of the recess with respect to a plane surface expanding in the X-axis direction and the Y-axis direction.
17. The light emitting device according to claim 1,
wherein the one side of the light emitting element adjacent to the second lead is inclined at an angle of 10 degrees or less with respect to the at least part of one side of the first lead or the second lead, when viewed in the Z-axis direction.
18. The light emitting device according to claim 1,
wherein the reflective members are made of a light transmissive resin filled with a white pigment.
19. The light emitting device according to claim 18,
wherein the white pigment comprises at least one selected from the group consisting of titanium oxide, alumina, magnesium oxide, antimony oxide, aluminum hydroxide, barium sulfate, magnesium carbonate, and barium carbonate.
20. The light emitting device according to claim 18,
wherein a center particle size of the white pigment is in a range between 0.1 μm to 5 μm.

* * * * *